Jan. 10, 1967 M. E. FRERKING 3,297,961
MEANS FOR TUNING CRYSTAL OSCILLATOR
Filed Oct. 18, 1965

INVENTOR.
MARVIN E. FRERKING
BY
Moody and Phillion
ATTORNEYS

United States Patent Office 3,297,961
Patented Jan. 10, 1967

3,297,961
MEANS FOR TUNING CRYSTAL OSCILLATOR
Marvin E. Frerking, Cedar Rapids, Iowa, assignor to Collins Radio Company, Cedar Rapids, Iowa, a corporation of Iowa
Filed Oct. 18, 1965, Ser. No. 497,370
6 Claims. (Cl. 331—116)

This invention relates to the tuning of crystal oscillators and, more particularly, it relates to the tuning of a Pierce type crystal oscillator without the aid of a frequency meter.

In a typical Pierce type crystal oscillator utilizing a grounded emitter transistor, the collector of the transistor is usually connected to ground through a parallel tuned circuit comprising a first capacitor and a first inductor. The base of the transistor is also connected to ground through a second capacitor. A feedback circuit from the collector electrode to the base electrode consists of the series combination of a second inductor and a crystal. Thus, there is formed a parallel resonant circuit consisting of the first capacitor connecting the collector electrode to ground, the second inductor, the crystal, and the second capacitor connecting the base electrode to ground. It should be noted that the parallel circuit connecting the collector electrode to ground is not tuned near the resonant frequency of the crystal for reasons to be explained later. Generally, however, such reasons relate to obtaining resonance of the crystal at one of its overtones, rather than at its fundamental resonant frequency.

In the prior art the tuning of the overall circuit has been accomplished with the use of a frequency meter and by varying said first capacitor until the frequency of the circuit is at the desired value. Another prior art means of tuning the circuit has been to vary said first capacitor while measuring the voltage appearing across the crystal. When the voltage across the crystal is at a minimum, the impedance of the crystal is presumably also at a minimum, and the circuit is tuned (the crystal being at a series resonance point). However, such is not actually the case, as will be discussed below.

More specifically, as said first capacitor means is varied, the voltage thereacross changes. If said first capacitor is increased in value, for example, the voltage thereacross will decrease as the reactance decreases. Thus, the applied voltage across the crystal would also tend to decrease since said applied voltage is derived from the voltage across said first capacitance. When the said first capacitor has been varied so that tuning has been accomplished, the voltage across the crystal should have reached its minimum value. However, this does not occur since, as the value of said first capacitance is increased, the voltage thereacross will decrease faster than the voltage increase across the crystal caused by the increasing impedance in the crystal. Thus, the resultant voltage across the crystal will tend to decrease for a short time after the exact point of series resonance has been passed, thereby giving a false indication of tuning.

It is an object of the present invention to provide a means of tuning the oscillator precisely, by means of measuring the true minimum voltage appearing across the crystal.

A second object of the invention is a crystal oscillator circuit which can be tuned without the aid of a frequency meter.

Another object of the invention is to tune the oscillator circuit accurately by varying the said inductance only, and determining the point at which minimum voltage appears across the crystal.

A third object of the invention is a means for improving the tuning of crystal type oscillators, generally.

In accordance with the invention, in the oscillator described above the said inductive means connected in series with the crystal is a variable inductance. Accurate tuning of the oscillator is accomplished by varying said variable inductance until the voltage across the crystal is a minimum. Tuning by means of such inductance means is a fine adjustment and ordinarily is preceded by a coarse adjustment made by varying the said first capacitance means.

The above-mentioned and other objects and features of the invention will be more fully understood from the following description thereof when read in conjunction with the drawings in which.

In the discussion of this invention the circuit of FIG. 1 will first be described in terms of tuning said circuit by varying capacitor 13 and allowing inductor 12 to remain constant. Such a description will point out the problem involved in tuning the circuit by the prior art method of varying capacitor 13. The purpose and value of the invention will then be more clearly understood from the description of the tuning of FIG. 1 by varying inductor 12.

Figure 1:
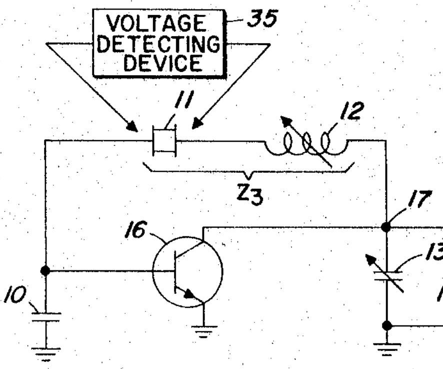
FIG. 1 is a schematic diagram of the invention.

In order for the circuit of FIG. 1 to be tuned correctly, the reactance of inductor 12 should be equal to the total capacitive reactance of the circuit comprised substantially of capacitor 10 and capacitor 13. While the inductor 14 does present some inductive reactance to the circuit, such reactive inductance is small at the frequency of operation. More specifically, such reactive inductance is very large at the frequency of operation and because it is in parallel with capacitor 13, the inductor 14 plays only a small part in the circuit.

Figures 2, 3:
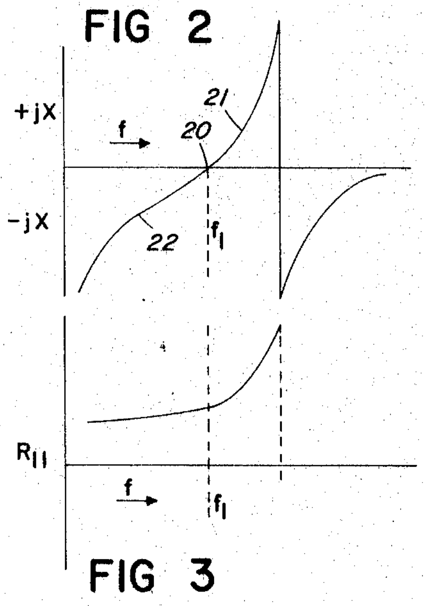
FIG. 2 shows the impedance versus frequency response characteristic of a crystal.
FIG. 3 shows the resistance versus frequency response characteristic of a crystal.
Figure 4:
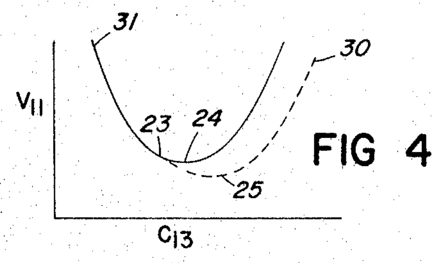
FIG. 4 shows the variation of the voltage across the crystal with variations of the capacitor 13 of FIG. 1.

Turning now to the tuning of the circuit by means of varying capacitor 13, assume that the circuit is tuned in such a manner that crystal 11 is operating at point 21 in the curve of FIG. 2. It will be noted that point 21 is at a frequency slightly above the series resonant frequency, which frequency occurs at point 20; the desired series resonant operating frequency of crystal 11. The point 23 of FIG. 4 represents the voltage which would appear across crystal 11 under such circumstances. Point 24 represents the minimum voltage which will appear across crystal 11 when crytsal 11 is operating at the series resonant condition. However, as indicated above, as the value of capacitor 13 is increased, the entire curve represented by the solid line in FIG. 4 is shifted to the right, as shown by dotted line curve 30, so that the minimum voltage appearing across crystal 11 will appear to be at point 25; a false reading.

A detailed description of the operation of the circuit when tuned by varying capacitor 13 from an initial operating condition, represented by point 21 of FIG. 2, is as follows.

To correct the false tuning of the circuit as represented by point 21 of FIG. 2, the capacitor 13 should be increased to decrease the capacitive reactance of the circuit and thereby cause the reactance of the crystal to shift towards a more capacitive reactance nature. Since point 21 is in the inductive area of operation, the net result of increasing the capacitance of capacitor 13 is to cause the point 21 to slide down the curve of FIG. 2 to the left, i.e., towards the capacitive reactance area of operation. If the value of capacitor 13 is increased sufficiently, the operating point of crystal 11 will reach point 20. It is important to note, however, that the potential across crystal 11 will continue to decrease as the value of capacitor 13 is increased, after passing point 20. The foregoing occurs because the drop in voltage across capacitor 13 decreases more rapidly than the increase in crystal voltage caused by the increasing crystal impedance as the operating point of the crystal moves to the left past point 20. Thus, at some point to the left of point 20, designated as point 22, the voltage across crystal 11 will be at a minimum. Such minimum voltage is represented by point 25 of FIG. 4. It can be seen from the curves of FIGS. 2 and 4 that crystal 11 is not operating at its series resonant point, but rather is operating at a frequency somewhat below the true series resonant point 20 and is capacitive in nature. Thus, a false adjustment has been obtained as a result of adjusting capacitor 13.

With the present invention the capacitor 13 can still be adjusted, but only to obtain a coarse adjustment. By coarse adjustment it is meant a rough adjustment can be made for crystals of different frequencies that might be inserted into the circuit. After completion of the coarse adjustment, a fine adjustment is made by adjusting variable inductor 12, the variability and operation of which, in combination with other elements in the circuit, constitutes the essence of the invention.

Assuming again that crystal 11 is operating at point 21 of FIG. 2 and is slightly inductive in nature, the value of inductor 12 can be adjusted to increase or decrease. Assume, first, that the value of inductor 12 is decreased, which is the incorrect adjustment. As inductor 12 is decreased, the reactance of crystal 11 must become more inductive in nature to maintain the proper balance between the inductive and capacitive reactances of the circuit. Thus, the operating characteristic of crystal 11 will slide up the curve to the right from point 21; the wrong direction. Since the total impedance of the crystal comprising the resistance and the reactance of the crystal increases, the voltage thereacross will also increase. It is to be noted that the voltage at point 17 remains substantially constant, since the value of capacitor 13 remains substantially constant.

Assume, now that the reactance of inductor 12 is increased rather than decreased. As a result the inductive reactance of the crystal must decrease in order to maintain a balance between capacitive and inductive reactances in the resonant circuit. Consequently, the operating point of crystal 11 will move to the left in FIG. 2, and slide down from point 21 towards point 20. Since the voltage of point 17 remains substantially constant, the voltage across crystal 11 will be at a minimum when the impedance thereof is pure resistance; which condition occurs when crystal 11 is at series resonance as indicated by point 20 in FIG. 2.

In FIG. 4, as discussed above, the solid curve 31 represents the operating characteristic of the crystal as the inductor 12 is varied. The point 24, which is the low point of solid curve 31, represents the minimum voltage across crystal 11 at the true series resonant operating point of crystal 11.

It is to be noted that the resistance of crystal 11 remains fairly constant over the tunable range, as shown in FIG. 3. It is only when the frequency of the crystal approaches the antiresonant frequency of the crystal that the resistance begins to rise sharply. In the region of time $t_1$, however, the resistance of crystal 11 can be seen to be quite constant. Thus, the variation of inductor 12 will not produce a sufficient change in the resistance of crystal 11 to seriously affect the tuning thereof in the region of the true series resonant condition.

Figures 5, 6:
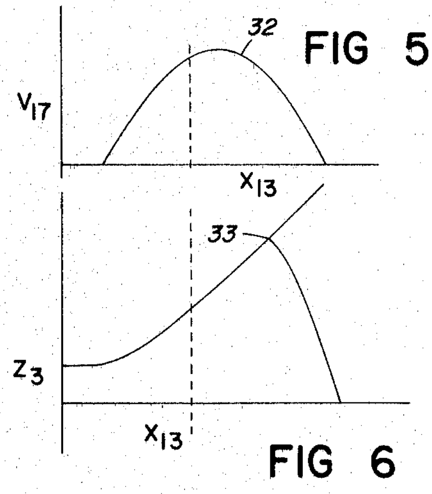
FIG. 5 shows the variation of the voltage at the collector electrode of the transistor of FIG. 1 as the capacitor 13 is varied.
FIG. 6 shows the variation of the total impedance across the crystal and the inductor 12 as the capacitor 13 is varied.

The curve of FIG. 5 shows that the voltage at point 17 of FIG. 1 rises to a certain value, as a reactance created by capacitor 13 is increased by decreasing capacitor 13. When the reactance 13 is increased beyond a certain point, the operability of the circuit begins to be impaired. As the reactance 13 is increased still further the circuit will eventually become inoperable, and the voltage appearing at point 17 will begin to decrease sharply beginning at about point 32. The curve of FIG. 6 shows the change in the total impedance $Z_3$ across crystal 11 and inductor 12, as the reactance of capacitor 13 is increased. Here, again, the inductive reactance of crystal 11 will increase up to a point 33, at which time the circuit begins to become inoperable and its characteristics somewhat indeterminate. When the circuit breaks down completely, the measurements across the crystal 11 are meaningless since there is no substantial signal in the circuit.

Figure 7:
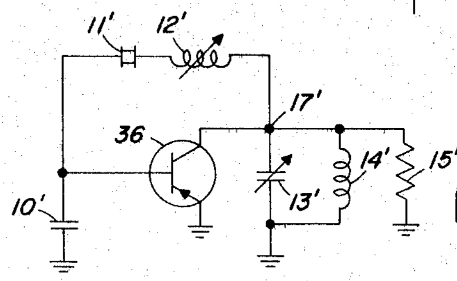
FIG. 7 is a schematic diagram of an alternative form of the invention.

Referring now to FIG. 7, there is shown a form of the invention employing a PNP type transistor rather than the NPN type transistor used in the circuit of FIG. 1. All of the other components of the circuit of FIG. 7 are the same as the corresponding components of FIG. 1, and are identified by the same reference characters, although primed.

It is to be noted that the forms of the invention shown and described herein are but preferred embodiments thereof, and that various changes can be made in the circuit arrangements without departing from the spirit or scope of the invention.

What is claimed is:

1. A tunable crystal oscillator comprising:
   an electron valve comprising an electron emitter electrode, an electron collector electrode and an electron control electrode;
   first capacitive impedance means connected across said collector and emitter electrodes;
   second capacitive impedance means connected across said control and emitter electrodes;
   and the series combination of crystal means and variable inductive means connected across said collector and control electrodes;
   said variable inductive means having a range of inductive reactance values, at and near the series resonant frequency of said crystal, including an inductive reactance equal to the total capacitive reactance of said first and second capacitive impedance means;
   and means for tuning said variable inductive means;
   and means for measuring the potential across said crystal means.

2. A tunable crystal oscillator in accordance with claim 1 in which said electron valve comprises an NPN type transistor.

3. A tunable crystal oscillator in accordance with claim 1 in which said electron valve comprises a PNP type transistor.

4. In a tunable crystal oscillator comprising:
   an electron valve comprising an electron emitter electrode, an electron collector electrode and an electron control electrode;
   first capacitive impedance means connected across said collector and emitter electrodes;
   second capacitive impedance means connected across said control and emitter electrodes;
   and the series combination of crystal means and variable inductive means connected across said collector and control electrodes;

said variable inductive means having a range of inductive reactance values, at and near the series resonant frequency of said crystal, including the total capacitive reactance of said first and second capacitive impedance means;

means for tuning said variable inductive means, and means for measuring the potential across said crystal means.

5. A tunable crystal oscillator in accordance with claim 4 in which said electron valve comprises an NPN type transistor.

6. A tunable crystal oscillator in accordance with claim 4 in which said electron valve comprises a PNP type transistor.

References Cited by the Examiner

UNITED STATES PATENTS 2,775,699 12/1956 Felch ---------------- 331—164

OTHER REFERENCES

Buchanan, J. P.: Handbook of Piezoelectric Crystals for Radio Equipment Designers, WADC, Tech. Report 54-248, pp. 279 December 1954, Wright Air Development Center.

ROY LAKE, *Primary Examiner.*

J. KOMINSKI, *Assistant Examiner.*